United States Patent [19]

Nicholson et al.

[11] Patent Number: 5,471,401
[45] Date of Patent: Nov. 28, 1995

[54] WAVEFORM LIBRARY FOR CHARACTERIZING AN AC POWER LINE SPECTRUM

[75] Inventors: Jamie Nicholson, Foster City; Alexander McEachern, Oakland, both of Calif.

[73] Assignee: Basic Measuring Instruments, Inc., San Jose, Calif.

[21] Appl. No.: 942,735

[22] Filed: Sep. 9, 1992

[51] Int. Cl.⁶ .................................................. G01R 19/25
[52] U.S. Cl. ........................... 364/483; 364/487; 364/492
[58] Field of Search ..................................... 364/550, 487, 364/483, 492, 497, 498; 395/2; 324/76.21, 76.39, 76.77

[56] References Cited

U.S. PATENT DOCUMENTS

| | | | |
|---|---|---|---|
| 4,035,773 | 7/1977 | Ghanem | 364/200 |
| 4,694,402 | 9/1987 | McEachern et al. | 364/487 |
| 4,804,921 | 2/1989 | Putrow et al. | 364/487 |
| 4,807,147 | 2/1989 | Halbert et al. | 364/487 |
| 4,809,189 | 2/1989 | Batson | 364/487 |
| 4,843,562 | 6/1989 | Kenyon et al. | 364/487 |
| 4,847,817 | 7/1989 | Au et al. | 367/135 |
| 4,964,055 | 10/1990 | Grassel et al. | 364/485 |
| 5,014,217 | 5/1991 | Savage | 364/498 |

Primary Examiner—Emanuel T. Voeltz
Assistant Examiner—Kyle J. Choi
Attorney, Agent, or Firm—Haverstock & Associates

[57] ABSTRACT

An apparatus and method for characterizing an alternating current power line which uses a library of waveforms and associated spectra of digitally sampled alternating current power system voltage or current waveforms. The library of waveforms is built as new waveforms are measured from the alternating current power line. A measured waveform that is not found in the library will be converted to frequency-domain representation, using a Discrete Fourier Transform, that will then be stored in the library. When the library becomes full, the frequency domain representation of the new waveform will be stored in place of the least used waveform currently stored in the library.

21 Claims, 1 Drawing Sheet

WAVEFORM LIBRARY FOR CHARACTERIZING AN AC POWER LINE SPECTRUM

FIELD OF THE INVENTION

This invention relates to a method and apparatus for calculating harmonic levels in voltage and current waveforms measured on AC (alternating current) power systems. More particularly, this invention relates to instruments which calculate harmonic levels in waveforms using a stored waveform library.

BACKGROUND OF THE INVENTION

Electric power is ordinarily delivered to residences, commercial facilities, and industrial facilities as an alternating current (AC) voltage that approximates a sine wave with respect to time. The electric power ordinarily flows through a residence or facility as an AC current that also approximates a sine wave with respect to time.

The electric power distribution system operates most efficiently and most safely when both the voltage and current are sine waves. However, certain kinds of loads draw current in a non-sinusoidal waveform. If these loads are large relative to the distribution system source impedance, the system voltage will become non-sinusoidal as well.

These non-sinusoidal voltage and current waveforms may be conveniently expressed as a Fourier series (a sum of sinusoidal waveforms of differing frequencies, magnitudes, and phase angles). Under most circumstances, the Fourier series for AC power system voltage and currents consists of a fundamental frequency, typically 50 Hertz or 60 Hertz, plus integer multiples of the fundamental frequency. These integer multiples of the fundamental frequency are referred to as "harmonics".

In AC power system measurements, it is a well-known technique to sample, at regular intervals much shorter than one period of the fundamental waveform, a voltage or current waveform for a length of time called a "sampling window", then convert those samples to digital values yielding a digital discrete time-domain representation of the waveform. It is also a well-known technique to employ a Discrete Fourier Transform (DFT) or a Fast Fourier Transform (FFT), which is a special case of the DFT, to convert that time-domain representation of the waveform to a frequency-domain representation. This frequency-domain representation can be used to measure the magnitude and phase angle of the harmonics present in an AC power system voltage or current waveform.

It is known to those familiar with the art that calculation of a frequency-domain representation of an AC power system waveform from a time-domain representation can require substantial computing power. In particular, where there are N samples in the time-domain representation, the number of complex multiplications in a Discrete Fourier Transform is proportional to $N^2$ and the number of complex multiplications in a Fast Fourier Transform is proportional to $N \log N$.

It is an object of the present invention to reduce the number of calculations required to produce a frequency-domain representation of AC power system voltage and current measurements.

SUMMARY OF THE INVENTION

An apparatus and method for characterizing an alternating current power line uses a library of waveforms and associated spectra of digitally sampled alternating current power system voltage or current waveforms. The library of waveforms is built as new waveforms are measured from the alternating current power line. A measured waveform that is not found in the library will be converted to frequency-domain representation, using a Discrete Fourier Transform, that will then be stored in the library. When the library becomes full, the frequency domain representation of the new waveform will be stored in place of the least used waveform currently stored in the library.

DETAILED DESCRIPTION OF A PREFERRED EMBODIMENT

Figure 1:
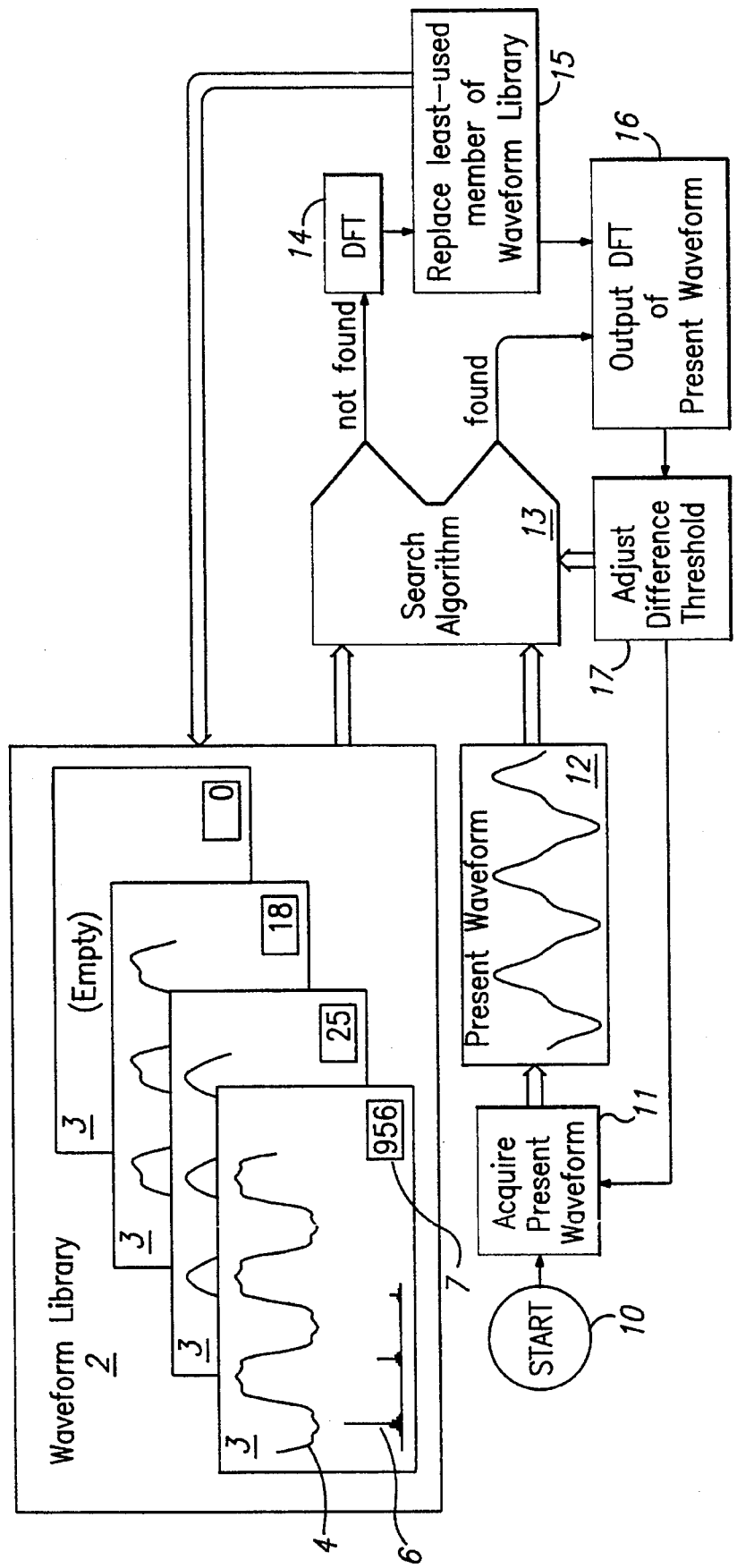
FIG. 1 shows a block diagram of the present invention.

It has been discovered that, at a given measuring location on an AC power system, harmonic voltage spectra and harmonic current spectra are likely to take discrete values. For example, if the only loads located downstream from a measuring location are a refrigerator and a fluorescent lightbulb, and each of these two loads has three possible states (off, starting, and on), there are only $3^2$, or 9, possible current harmonic spectra. As the number of downstream loads increases, the number of possible spectra increases, but the characteristics of the spectra tend to be dominated by major loads.

The present invention takes advantage of this discovered characteristic of AC power systems by constructing a library of waveforms that have been previously observed at this measuring location and their associated frequency-domain representations. When a present waveform is acquired, it is first compared to each member of the library until a sufficiently close match is found. If a sufficiently close match is found in the library, the corresponding frequency-domain representation is retrieved from the library and no further calculations are required. If no sufficiently close match is found in the library, the present waveform's corresponding frequency-domain representation is calculated using any well-known technique, such as the Fast Fourier Transform, then both the waveform and its corresponding frequency-domain representation are placed in the library, replacing if necessary the least-used member in the library.

It will be recognized by those familiar with the art that the computing power required for a waveform library search will rise in proportion to N×M integer compare operations, where N is the number of samples in the waveform and M is the number of waveforms in the library. A library of waveforms can be constructed in such a way that N×M integer compares requires substantially less computing power than the traditional N log N complex multiplications required by a FFT. In general, the number of members in the library must meet the requirement M<< (N log N)/R, where M is the number of members in the waveform library, R is the ratio of computing power between a complex multiplication operation and an integer compare operation, and N is the number of digital samples in a time-domain representation of a single waveform.

FIG. 1 illustrates a block diagram of the present invention. In this block diagram, a continuing loop is illustrated in which a time-domain waveform is acquired in the Block 11 and its corresponding DFT-based frequency-domain representation is output by the Block 16.

The process begins at the START Block 10. Using any standard time-domain sampling technique such as a regularly-strobed analog-to-digital converter, the Block 11 acquires a time-domain representation of the AC power system voltage or current waveform. The Block 12 represents the time-domain representation of the present AC power system waveform acquired by the Block 11, in this case a current waveform.

The Waveform Library 2 of FIG. 1 is composed of a plurality of members 3, each member comprising a time-domain representation 4 of a waveform, a corresponding frequency-domain representation 6 of that waveform, and a counter 7 that tracks how frequently the particular Waveform Library member has been used.

The Search Algorithm 13 accepts as input the Present Waveform from the Block 12, a difference threshold, and the waveforms from the Waveform Library 2. The difference threshold determines how closely the Present Waveform 12 must match a time-domain representation of a member of the Waveform Library 2 in order for the Search Algorithm 13 to determine that a waveform that matches has been found. Using any well-known technique such as point-by-point amplitude comparison, the Search Algorithm 13 determines whether or not a waveform sufficiently close to the Present Waveform 12 has been found in the Waveform Library 2.

The Search Algorithm 13, prior to comparing the Present Waveform 12 with the waveforms stored in the Waveform Library 2, must ensure that the two waveforms match in phase. In the preferred embodiment of the present invention, the Search Algorithm 13 employs any well-known software technique such as matching positive-going zero-crossings to match the two waveforms in phase. In an alternate embodiment of the present invention, well-known hardware circuits such as multiplying phase-locked loops coupled to an Analog-to-Digital converter sampling clock ensure that all waveforms are sampled at a fixed phase position.

If a waveform sufficiently close to the Present Waveform 12 has been found by the Search Algorithm 13 in the Waveform Library 2, control is passed to the Block 16 which outputs the frequency domain representation 6 of the waveform that was found in the Waveform Library 2. The usage counter 7 of that member of the Waveform Library 2 is incremented, and control is passed to the Block 17 whose function is described in more detail below.

If no waveform sufficiently close to the Present Waveform 12 has been found by the Search Algorithm 13 in the Waveform Library 2, control is passed to the Block 14 which calculates a frequency-domain representation of the Present Waveform 12 by performing a DFT. The Block 15 places the Present Waveform 12 and its corresponding frequency-domain representation in the Waveform Library 2, replacing the least-used member of the Waveform Library 2 as determined by the contents of the usage counters 7, if the Waveform Library is full. Control is then passed to the Block 16, which outputs the frequency-domain representation of the waveform 12, the Block 16 then passes control to the Block 17.

The Block 17 may adjust the difference threshold used by the Search Algorithm 13 to determine if a present waveform 12 is sufficiently close to a waveform stored in the Waveform Library 2. The optimal level for the difference threshold is a compromise. A large difference threshold makes it more likely that a Present Waveform 12 will be found in the Waveform Library 2, and minimizes M, the number of members 3, thus reducing computing power. On the other hand, a small difference threshold ensures that the frequency-domain representation output by the Block 16 precisely represents the Present Waveform 12. The Block 17 is employed to optimize the difference threshold in cases where threshold limits are applied to the harmonic measurements, such as limits on voltage or current Total Harmonic Distortion (THD) or limits on individual current harmonics. The Block 17 determines whether the frequency-domain representation of the Present Waveform 12 is approaching one of these limits. If it is approaching one of these limits, the difference threshold is reduced thus increasing computation and storage requirements but ensuring that harmonic limits will be properly measured. If the frequency-domain representation of the Present Waveform 12 is well below or well above all of these limits, the difference threshold is increased, thus reducing computation requirements. Once, the difference threshold has been adjusted by the Block 17 control is then passed to the Block 11, where a new waveform is acquired and the process recommences.

In an alternate embodiment of the invention, the difference threshold employed by the Search Algorithm 13 is fixed and the Block 17 is bypassed. In another alternate embodiment of the invention, all non-zero usage counters 7 are periodically decremented at an interval of time greater than the interval of time between waveform acquisitions by the Block 11.

Various modifications may be made to the preferred embodiment without departing from the spirit and scope of the invention as defined by the appended claims.

We claim:

1. An apparatus coupled to an alternating current power line for characterizing an alternating current power line voltage or current frequency spectrum comprising:

a. means for acquiring a power line voltage or current waveform and converting it into an acquired time-domain representation, coupled to the alternating current power line;

b. means for comparing the acquired waveform to a library of previously stored waveforms, the library having a digital time-domain representation and a corresponding frequency-domain representation for each waveform stored;

c. means for retrieving the corresponding frequency-domain representation, if there is a waveform stored in the library which corresponds to the acquired time-domain representation within a difference threshold;

d. means for converting the acquired time-domain representation into an acquired frequency-domain representation, if there is no waveform stored in the library which corresponds to the acquired time-domain representation within a difference threshold; and e. means for storing the acquired frequency-domain representation in the waveform library, if there is no waveform stored in the library which corresponds to the acquired time-domain representation within a difference threshold.

2. The apparatus as claimed in claim 1 wherein the difference threshold is a predetermined programmed value which determines how closely the acquired time-domain representation must match an entry in the waveform library.

3. The apparatus as claimed in claim 1 further comprising means for determining when the library is full.

4. The apparatus as claimed in claim 3 further comprising means for determining which of the waveforms stored in the library is a least retrieved waveform and means for storing the acquired frequency-domain representation in place of the least retrieved waveform, if the waveform library is full.

5. An apparatus coupled to an alternating current power line for characterizing an alternating current power line voltage or current frequency spectrum comprising:
 a. means for acquiring sampled values of a power line voltage or current waveform at a predetermined interval of time forming an acquired signal, the means for acquiring coupled to the alternating current power line;
 b. first means for converting the sampled values into digital values forming a digital time-domain representation of the waveform;
 c. second means for converting the digital time-domain representation into a corresponding frequency-domain representation;
 d. first means for storing a plurality of the digital time-domain representations and their corresponding frequency domain representations, forming a waveform library;
 e. means for comparing a digital time-domain representation of a subsequent measured waveform with each of the plurality of digital time-domain waveforms stored in the waveform library for determining if the subsequent measured waveform representation corresponds to any of the plurality of waveform representations stored in the waveform library within a difference threshold;
 f. means for retrieving the corresponding frequency-domain representation of the corresponding digital time-domain representation, if there is a waveform representation stored in the waveform library which corresponds to the subsequent measured waveform within the difference threshold; and
 g. second means for storing a frequency=domain representation of the subsequent measured waveform if there is no waveform representation stored in the waveform library which corresponds to the subsequent measured waveform within the difference threshold wherein the difference threshold determines how closely the subsequent measured waveform must match a digital time-domain representation of a waveform stored in the waveform library and further wherein the difference threshold is adjusted according to whether or not the frequency-domain representation of the subsequent measured waveform is approaching any one of predetermined threshold limits on voltage or current Total Harmonic Distortion or predetermined limits on individual current harmonics.

6. An apparatus coupled to an alternating current power line for characterizing an alternating current power line voltage or current frequency spectrum comprising:
 a. means for acquiring sampled values of a power line voltage or current waveform at a predetermined interval of time forming an acquired signal, the means for acquiring coupled to the alternating current power line;
 b. first means for converting the sampled values into digital values forming a digital time-domain representation of the waveform;
 c. second means for converting the digital time-domain representation into a corresponding frequency-domain representation;
 d. first means for storing a plurality of the digital time-domain representations and their corresponding frequency-domain representations, forming a waveform library;
 e. means for comparing a digital time-domain representation of a subsequent measured waveform with each of the plurality of digital time-domain waveforms stored in the waveform library for determining if the subsequent measured waveform representation corresponds to any of the plurality of waveform representations stored in the waveform library within a difference threshold;
 f. means for retrieving the corresponding frequency-domain representation of the corresponding digital time-domain representation, if there is a waveform representation stored in the waveform library which corresponds to the subsequent measured waveform within the difference threshold; and
 g. second means for storing a frequency-domain representation of the subsequent measured waveform if there is no waveform representation stored in the waveform library which corresponds to the subsequent measured waveform within the difference threshold.

7. The apparatus as claimed in claim 6 wherein the means for comparing employs a point-by-point amplitude comparison to determine if the subsequent measured waveform representation corresponds to any of the plurality of waveform representations stored in the waveform library within the difference threshold.

8. The apparatus as claimed in claim 6 wherein the difference threshold is a predetermined programmed value which determines how closely the subsequent measured waveform must match a time-domain representation of a waveform stored in the waveform library.

9. The apparatus as claimed in claim 6 wherein the first and second means for storing comprises a random-access memory which has a fixed amount of space that can be used to store the waveform library.

10. The apparatus as claimed in claim 9 further comprising means for determining when the waveform library is full.

11. The apparatus as claimed in claim 10 further comprising means for determining which of the waveforms stored in the waveform library has been retrieved the least and means for storing the frequency-domain representation of the subsequent measured waveform in the place of the waveform in the waveform library which has been retrieved the least, if the waveform library is full.

12. The apparatus as claimed in claim 11 wherein the means for determining which of the waveforms stored in the waveform library has been retrieved the least comprises a usage counter for each waveform which is stored with the representation of each waveform, the counter being incremented every time a waveform's representation is retrieved.

13. The apparatus as claimed in claim 12 wherein the usage counters for each waveform, which do not equal zero, are periodically set to zero, the period constituting an interval of time greater than the predetermined interval.

14. A method of determining a frequency spectrum of an alternating current power line voltage or current waveform comprising the steps of:
 a. acquiring sampled values of the power line voltage or current waveform at a predetermined interval of time;
 b. convering the sampled values into digital values forming an acquired digital time-domain representation of the waveform;
 c. comparing the acquired digital time-domain representation with each of a plurality of stored digital time-domain representations stored in a waveform library, the waveform library having a corresponding stored frequency-domain representation for each stored digital time-domain representation, to determine if the acquired digital time domain representation matches any of the stored digital time-domain representations within a difference threshold;

d. retrieving a corresponding stored frequency-domain representation from the waveform library if the acquired digital time-domain representation matches one of the stored digital time-domain representations;

e. converting the acquired digital time-domain representation into a corresponding acquired frequency domain representation if there is no match; and f. storing the corresponding acquired frequency domain representation in the waveform library if the acquired digital time-domain representation does not match any of the stored digital time-domain representations wherein the difference threshold determines how closely the digital time-domain representation must match a stored digital time-domain representation and further wherein the difference threshold is adjusted according to whether or not the frequency-domain representation of the waveform is approaching predetermined threshold limits on voltage or current Total Harmonic Distortion or predetermined limits on individual current harmonics.

15. A method of determining a frequency spectrum of an alternating current power line voltage or current waveform comprising the steps of:

a. acquiring sampled values of the power line voltage or current waveform at a predetermined interval of time;

b. converting the sampled values into digital values forming an acquired digital time-domain representation of the waveform;

c. comparing the acquired digital time-domain representation with each of a plurality of stored digital time-domain representations stored in a waveform library, the waveform library having a corresponding stored frequency-domain representation for each stored digital time-domain representation, to determine if the acquired digital time-domain representation matches any of the stored digital time-domain representations within a difference threshold;

d. retrieving a corresponding stored frequency-domain representation from the waveform library if the acquired digital time-domain representation matches one of the stored digital time-domain representations;

e. converting the acquired digital time-domain representation into a corresponding acquired frequency-domain representation if there is no match; and f. storing the corresponding acquired frequency-domain representation in the waveform library if the acquired digital time-domain representation does not match any of the stored digital time-domain representations.

16. The method as claimed in claim 15 wherein the step of comparing is completed by performing a point-by-point amplitude comparison.

17. The method as claimed in claim 15 wherein the difference threshold is a predetermined programmed value which determines how closely the acquired digital time-domain representation must match a stored digital time-domain representation.

18. The method as claimed in claim 15 further comprising the step of determining when the waveform library is full.

19. The method as claimed in claim 18 further comprising the step of determining a least retrieved waveform stored in the waveform library and storing the corresponding acquired frequency-domain representation in the place of the least retrieved waveform if the waveform library is full.

20. The method as claimed in claim 19 wherein the step of determining which of the waveforms has been retrieved the least is performed using a usage counter for each waveform, which is stored with the representation of each waveform, the counter being incremented each time the waveform's representation is retrieved.

21. The method as claimed in claim 20 further comprising the step of setting all usage counters which do not already equal zero to zero at a periodic interval which is greater than the predetermined interval of time.

* * * * *

UNITED STATES PATENT AND TRADEMARK OFFICE
CERTIFICATE OF CORRECTION

PATENT NO. : 5,471,401

DATED : November 28, 1995

INVENTOR(S) : Nicholson et al.

It is certified that error appears in the above-identified patent and that said Letters Patent is hereby corrected as shown below:

In column 5, line 31, "frequency=domain" should have been typed --frequency-domain--.

Signed and Sealed this

Twenty-seventh Day of February, 1996

Attest:

BRUCE LEHMAN

Attesting Officer

Commissioner of Patents and Trademarks